(12) United States Patent
Lai et al.

(10) Patent No.: US 12,069,873 B2
(45) Date of Patent: Aug. 20, 2024

(54) RESISTIVE MEMORY CELL AND ASSOCIATED CELL ARRAY STRUCTURE

(71) Applicant: eMemory Technology Inc., Hsin-Chu (TW)

(72) Inventors: Tsung-Mu Lai, Hsinchu County (TW); Wei-Chen Chang, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 500 days.

(21) Appl. No.: 17/462,040

(22) Filed: Aug. 31, 2021

(65) Prior Publication Data

US 2022/0199622 A1 Jun. 23, 2022

Related U.S. Application Data

(60) Provisional application No. 63/127,165, filed on Dec. 18, 2020.

(51) Int. Cl.
  *H10B 99/00* (2023.01)
  *G11C 11/416* (2006.01)

(52) U.S. Cl.
  CPC ............ *H10B 99/00* (2023.02); *G11C 11/416* (2013.01)

(58) Field of Classification Search
  None
  See application file for complete search history.

(56) References Cited

U.S. PATENT DOCUMENTS

| | | |
|---|---|---|
| 9,178,000 B1 | 11/2015 | Nardi et al. |
| 9,281,074 B2 | 3/2016 | Wu et al. |
| 2006/0221663 A1* | 10/2006 | Roehr ............... G11C 11/16 365/148 |
| 2017/0053925 A1* | 2/2017 | Wong ............... H10B 20/25 |

(Continued)

FOREIGN PATENT DOCUMENTS

| | | | | |
|---|---|---|---|---|
| TW | 201626499 A | * | 7/2016 | ........ H01L 27/11558 |
| WO | WO2016/048681 A1 | | 3/2016 | |

OTHER PUBLICATIONS

E. Ray Hsieh et al., "A 14-nm FinFET Logic CMOS Process Compatible RRAM Flash With Excellent Immunity to Sneak Path", Dec. 2017, pp. 4910-4918, vol. 64, No. 12, IEEE Transactions on Electron Devices.

(Continued)

*Primary Examiner* — Evren Seven
*Assistant Examiner* — Cole Leon Lindsey
(74) *Attorney, Agent, or Firm* — WPAT, P.C

(57) ABSTRACT

A cell array structure includes a first resistive memory cell. The first resistive memory cell includes a well region, a first doped region, a merged region, a first gate structure, a second gate structure and a first metal layer. The first doped region is formed under a surface of the well region. The merged region is formed under the surface of the well region. The first gate structure is formed over the surface of the well region between the first doped region and the merged region. The first gate structure includes a first insulation layer and a first conductive layer. The second gate structure is formed over the merged region. The second gate structure includes a second insulation layer and a second conductive layer. The first metal layer is connected with the first doped region.

16 Claims, 9 Drawing Sheets

(56) References Cited

U.S. PATENT DOCUMENTS

2017/0345828 A1* 11/2017 Wu .................... H02M 3/07
2017/0346394 A1* 11/2017 Chang .................. H03K 5/134

OTHER PUBLICATIONS

Chin Yu Mei et al., "28-nm 2T High-K Metal Gate Embedded RRAM With Fully Compatible CMOS Logic Processes", Oct. 2013, pp. 1253-1255, vol. 34, No. 10, IEEE Electron Device Letters.

* cited by examiner

RESISTIVE MEMORY CELL AND ASSOCIATED CELL ARRAY STRUCTURE

This application claims the benefit of U.S. provisional application Ser. No. 63/127,165, filed Dec. 18, 2020, the subject matter of which is incorporated herein by reference.

FIELD OF THE INVENTION

The present invention relates to a memory cell of a memory, and more particularly to a resistive memory cell in a bipolar operation mode and an associated cell array structure.

BACKGROUND OF THE INVENTION

A resistive random-access memory (ReRAM) is one kind of non-volatile memory. The resistive random-access memory comprises plural resistive random-access memory cells (ReRAM cells). Since the resistive memories are manufactured with less processing steps and have faster writing speed, the resistive memories are suitably used to replace the embedded flash memory in a system-on-chip (SOC).

FIG. 1 schematically illustrates the structure of a conventional resistive memory cell. As shown in FIG. 1, the resistive memory cell 100 comprises a bottom electrode 106, an insulation layer 104 and a top electrode 102, which are arranged in a stack form. After the resistive memory cell 100 is fabricated, the resistive memory cell 100 is in an initial state.

Before the resistive memory cell 100 is enabled, a forming action is performed to apply a first voltage Va and a second voltage Vb to the top electrode 102 and the bottom electrode 106, respectively. The voltage difference Vab between the first voltage Va and the second voltage Vb is a forming voltage, i.e., Vab=Va−Vb. When the top electrode 102 and the bottom electrode 106 receive the first voltage Va and the second voltage Vb, the cluster of oxygen vacancies in the insulation layer 104 forms a conducting filament 108. In addition, the conducting filament 108 is connected with the top electrode 102 and the bottom electrode 106.

After the resistive memory cell 100 undergoes the forming action, plural bias voltages lower than the forming voltage are provided to the resistive memory cell 100. Consequently, the state of the resistive memory cell 100 can be arbitrarily switched between a set state and a reset state. The resistive memory cell 100 in the set state has a low resistance value. The resistive memory cell 100 in the reset state has a high resistance value. The operations of the resistive memory cell 100 will be described as follows.

Moreover, when the resistive memory cell 100 is in the set state corresponding to the low resistance value, a reset action may be performed to switch the set state to a reset state corresponding to the high resistance value. While the reset action is performed, a reset voltage is applied to the top electrode 102 and the bottom electrode 106. Meanwhile, the conducting filament 108 within the insulation layer 104 is treated by a redox process. Consequently, the conducting filament 108 is almost not connected between the top electrode 102 and the bottom electrode 106. In other words, after the reset action is completed, the region between the top electrode 102 and the bottom electrode 106 has the high resistance value (i.e., in the reset state).

When the resistive memory cell 100 is in the reset state corresponding to the high resistance value, the resistive random-access memory 100 can be switched to the set state through a set action. While the set action is performed, a set voltage is applied to the top electrode 102 and the bottom electrode 106. Consequently, the conducting filament 108 within the insulation layer 104 can be well connected between the top electrode 102 and the bottom electrode 106. That is, after the set action is completed, the region between the top electrode 102 and the bottom electrode 106 has the low resistance value (i.e., in the set state).

During a program cycle, in response to a program action, the resistive memory cell 100 can be selectively in the set state through the set action or in the reset state through the rest action. In other words, the set state and the reset state are two storage states of the resistive memory cell 100.

Generally, depending on the method of providing the set voltage and the reset voltage, the resistive memory cells are classified into two types, i.e., the resistive memory cell in a unipolar operation mode and the resistive memory cell in a bipolar operation mode. In case that the resistive memory cell is in the unipolar operation mode, the resistive memory cell can be biased either to have a positive voltage difference Vab (i.e. Va−Vb>0) for both set and reset actions, or to have a negative voltage difference Vab (i.e. Va−Vb<0) for both set and reset actions. In case that the resistive memory cell is in the bipolar operation mode, the resistive memory cell can be biased either to have the positive voltage difference Vab for the set action and the negative voltage difference Vab for the reset action, or to have the negative voltage difference Vab for the set action and the positive voltage difference Vab for the reset action.

FIG. 2A schematically illustrates the bias voltages for performing a set action and a reset action on the resistive memory cell in a unipolar operation mode. FIG. 2B schematically illustrates the bias voltages for performing a set action and a reset action on the resistive memory cell in a bipolar operation mode.

The dotted curve as shown in FIG. 2A indicates that the resistive memory cell 100 is originally in the reset state. By providing a set voltage higher than about 1.88V, the magnitude of the current flowing through the resistive memory cell 100 rises. Since the resistance of the resistive memory cell 100 decreases, the resistive memory cell 100 is switched to the set state. The solid curve as shown in FIG. 2A indicates that the resistive memory cell 100 is originally in the set state. By providing a reset voltage higher than about 1.78V, the magnitude of the current flowing through the resistive memory cell 100 drops. Since the resistance of the resistive memory cell 100 increases, the resistive memory cell 100 is switched to the reset state. In FIG. 2A, two different positive voltage differences (i.e. 1.78V and 1.88V) are used for the resistive memory cell 100 to switch between the set action and the reset action in the unipolar operation mode.

The dotted curve as shown in FIG. 2B indicates that the resistive memory cell 100 is originally in the reset state. By providing a set voltage lower than about −2.4V, the magnitude of the current flowing through the resistive memory cell 100 rises. Since the resistance of the resistive memory cell 100 decreases, the resistive memory cell 100 is switched to the set state. The solid curve as shown in FIG. 2B indicates that the resistive memory cell 100 is originally in the set state. By providing a reset voltage higher than about 1.5V, the magnitude of the current flowing through the resistive memory cell 100 drops. Since the resistance of the resistive memory cell 100 increases, the resistive memory cell 100 is switched to the reset state. In FIG. 2B, one positive voltage difference (i.e. 1.5V) and one negative voltage difference (i.e. −2.4V) are used for the resistive memory cell 100 to switch between the set action and the reset action in the bipolar operation mode.

According to the results of FIGS. 2A and 2B, the set voltage and the reset voltage of the resistive memory cell in the unipolar operation mode are very close, and the set voltage and the reset voltage of the resistive memory cell in the bipolar operation mode are far apart. In other words, the resistive memory cell in the bipolar operation mode can be controlled more easily.

SUMMARY OF THE INVENTION

The present invention provides a resistive memory cell, with implanted doped region as a bottom electrode under the insulation layer of the resistive memory cell, in a bipolar operation mode and an associated cell array structure. The cell array structure comprises plural resistive memory cells.

An embodiment of the present invention provides a cell array structure. The cell array structure includes a first resistive memory cell. The first resistive memory cell includes a first-type well region, a second-type first doped region, a second-type merged region, a first gate structure, a second gate structure and a first metal layer. The second-type first doped region is formed under a surface of the first-type well region. The second-type merged region is formed under the surface of the first-type well region. The first gate structure is formed over the surface of the first-type well region between the second-type first doped region and the second-type merged region. The first gate structure includes a stack structure with a first insulation layer and a first conductive layer. The first conductive layer is served as a first word line. The second gate structure is formed over the second-type merged region. The second gate structure includes a stack structure with a second insulation layer and a second conductive layer. The second conductive layer is served as a first source line. The first metal layer is connected with the second-type first doped region. The first metal layer is served as a first bit line. During a forming action, the first source line receives a forming voltage, the first word line receives an on voltage, the first bit line receives a ground voltage, and a conducting filament is formed in the second insulation layer. During a reset action, the first source line receives a reset voltage, the first word line receives the on voltage, and the first bit line receives a voltage lower than the reset voltage, so that the first resistive memory cell is in a reset state. During a set action, the first word line receives the on voltage, the first bit line receives a set voltage, and the first source line receives a voltage lower than the set voltage, so that the first resistive memory cell is in a set state.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
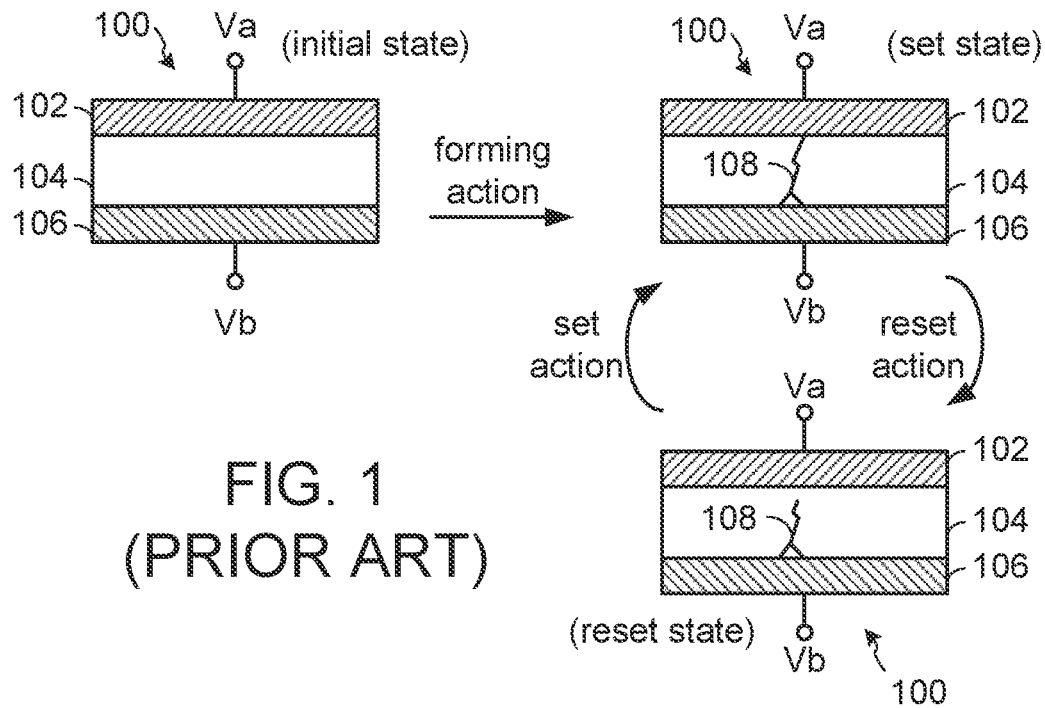
FIG. 1 (prior art) schematically illustrates the structure of a conventional resistive random-access memory cell.
Figure 2A:
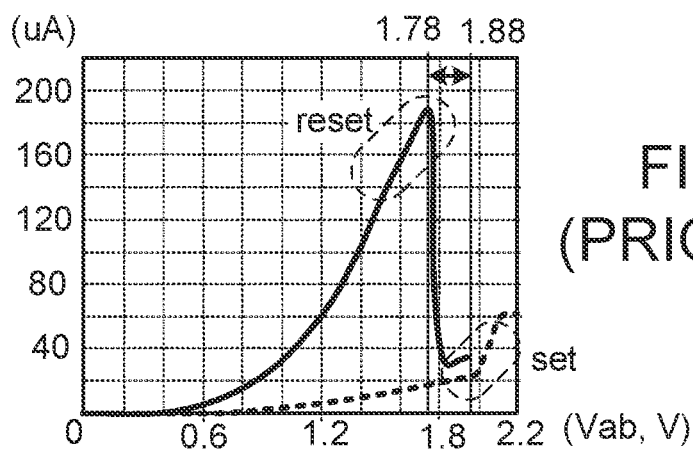
FIG. 2A (prior art) schematically illustrates the bias voltages for performing a set action and a reset action on the resistive memory cell in a unipolar operation mode.
Figure 2B:
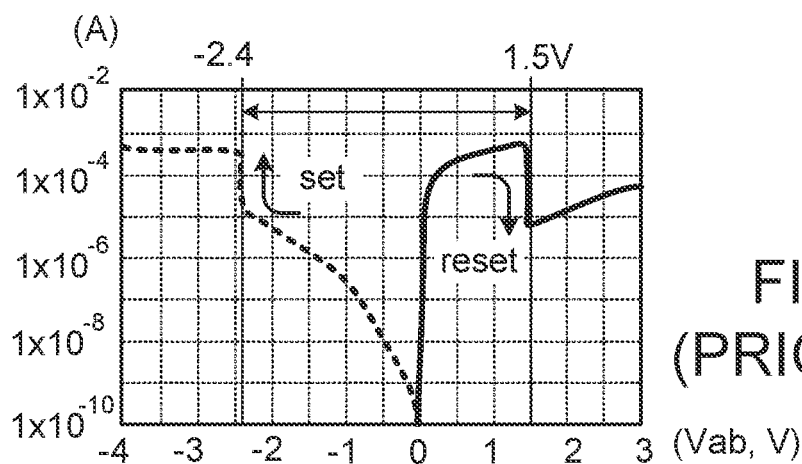
FIG. 2B (prior art) schematically illustrates the bias voltages for performing a set action and a reset action on the resistive memory cell in a bipolar operation mode.
Figure 3A:
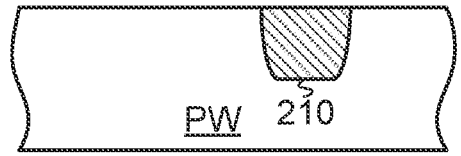
FIGS. 3A, 3B and 3C are schematic cross-sectional views illustrating a process of manufacturing a resistive memory cell according to a first embodiment of the present invention.
Figure 3B:
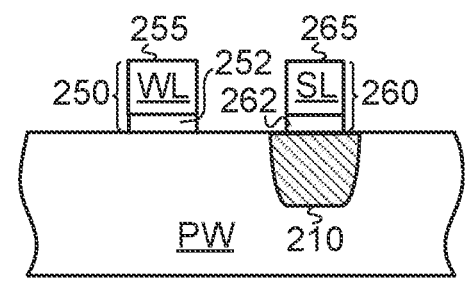
Figure 3C:
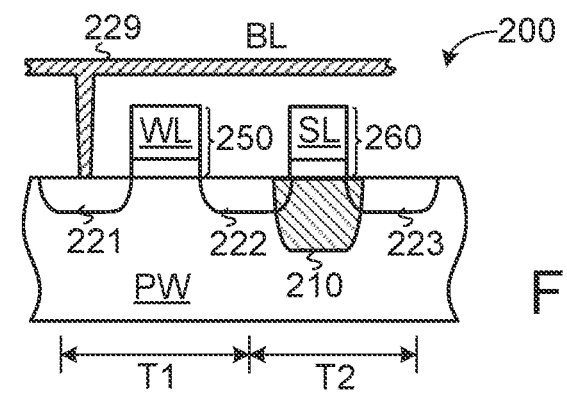
Figure 3D:
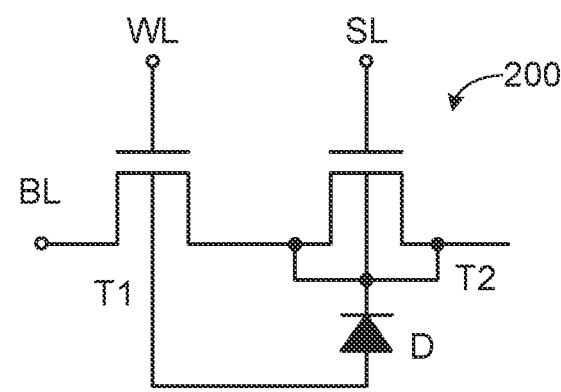
FIG. 3D is a schematic equivalent circuit diagram of the resistive memory cell according to the first embodiment of the present invention.

FIGS. 3A, 3B and 3C are schematic cross-sectional views illustrating a process of manufacturing a resistive memory cell according to a first embodiment of the present invention. FIG. 3D is a schematic equivalent circuit diagram of the resistive memory cell according to the first embodiment of the present invention.

Please refer to FIG. 3A. Firstly, an N-type implanted region 210 is formed in a P-well region PW.

Please refer to FIG. 3B. Then, two gate structures 250 and 260 are formed. The first gate structure 250 is formed over the surface of the P-well region PW. The second gate structure 260 is formed over the surface of the N-type implanted region 210. The gate structures 250 and 260 have the same structure.

The first gate structure 250 comprises an insulation layer 252 and a conductive layer 255. The second gate structure 260 comprises an insulation layer 262 and a conductive layer 265. Take the second gate structure 260 for example. The insulation layer 262 is located over the surface of the N-type implanted region 210, and the conductive layer 265 is located above the insulation layer 262. The conductive layer 265 is a top electrode above the insulation layer 262 of the resistive memory cell 200, and the N-type implanted region 210 is a bottom electrode under the insulation layer 262 of the resistive memory cell 200. The conductive layer 255 is used as a word line WL. The conductive layer 265 is used as a source line SL.

In this embodiment, each of the insulation layer 262 and the conductive layer 265 is a stack structure with plural material layers. For example, the insulation layer 262 is a stack structure with a silicon dioxide layer ($SiO_2$) and a hafnium dioxide layer ($HfO_2$), and the conductive layer 265 is a stack structure with a titanium layer (Ti), a titanium nitride layer (TiN) and a tungsten layer (W). The hafnium dioxide layer ($HfO_2$) is a high dielectric constant (high-k) material layer, which is suitable for the resistive memory. The silicon dioxide layer ($SiO_2$) is located over the surface of the N-type implanted region 210. The hafnium dioxide layer ($HfO_2$) is located over the silicon dioxide layer ($SiO_2$). The titanium layer (Ti) is located over the hafnium dioxide layer ($HfO_2$). The titanium layer (TiN) is located over the titanium layer (Ti). The tungsten layer (W) is located over the titanium nitride layer (TiN).

It is noted that the examples of the material layers of the gate structure are not restricted. That is, the material layers may be modified. For example, in another embodiment, the high high-k material layer in the insulation layer 262 is replaced by a tantalum oxide layer ($Ta_2O_5$). Alternatively, the conductive layer 265 is a stack structure with a titanium layer (Ti) and a tungsten layer (W).

Please refer to FIG. 3C. After an implantation process is performed, a first doped region 221, a second doped region 222 and a third doped region 223 are formed under the exposed surface of the P-type well region PW. The first doped region 221, the second doped region 222 and the third doped region 223 are N-type doped regions. The first gate structure 250 is located over the surface of the P-type well region PW between the first doped region 221 and the second doped region 222. The second gate structure 260 is located over the surface of the N-type implanted region 210 between the second doped region 222 and the third doped region 223. Specifically, the insulation layer 262 of the second gate structure 260 is formed between the conductive layer 265 and the implanted region 210, and the insulation layer 262 is contacted with the implanted region 210. The second doped region 222, the third doped region 223 and the N-type implanted region 210 are overlapped with each other to be collaboratively formed as an N-type merged region. In other words, the second gate structure 260 is located over the N-type merged region and the insulation layer 262 is contacted with the N-type merged region. The N-type merged region can be regarded as the bottom electrode under the insulation layer 262 of the resistive memory cell 200.

Then, a metal layer 229 is connected with the first doped region 221 through a contact hole. Meanwhile, the resistive memory cell 200 is fabricated. The metal layer 229 is used as a bit line BL of the resistive memory cell 200.

Please refer to FIG. 3C again. In the P-type well region PW, the first doped region 221, the second doped region 222 and the first gate structure 250 are collaboratively formed as a first transistor T1. The second doped region 222, the third doped region 223 and the second gate structure 260 are collaboratively formed as a second transistor T2. Since the second doped region 222, the third doped region 223 and the N-type implanted region 210 are collaboratively formed as the N-type merged region, it can be considered that two drain/source terminals and a body terminal of the second transistor T2 are connected with each other. Moreover, a p-n junction is formed between the N-type merged region and the P-type well region PW. The p-n junction can be regarded as a diode.

As shown in FIG. 3D, the resistive memory cell 200 comprises the first transistor T1, the second transistor T2 and a diode D. The first drain/source terminal of the first transistor T1 is connected with the bit line BL. The gate terminal of the first transistor T1 is connected with the word line WL. The first drain/source terminal, the second drain/source terminal and the body terminal of the second transistor T2 are connected with each other. The first drain/source terminal of the second transistor T2 is connected with the second drain/source terminal of the first transistor T1. The gate terminal of the second transistor T2 is connected to with the source line SL. A first terminal of the diode D is connected with the body terminal of the second transistor T2. A second terminal of the diode D is connected with the body terminal of the first transistor T1.

Figure 4:
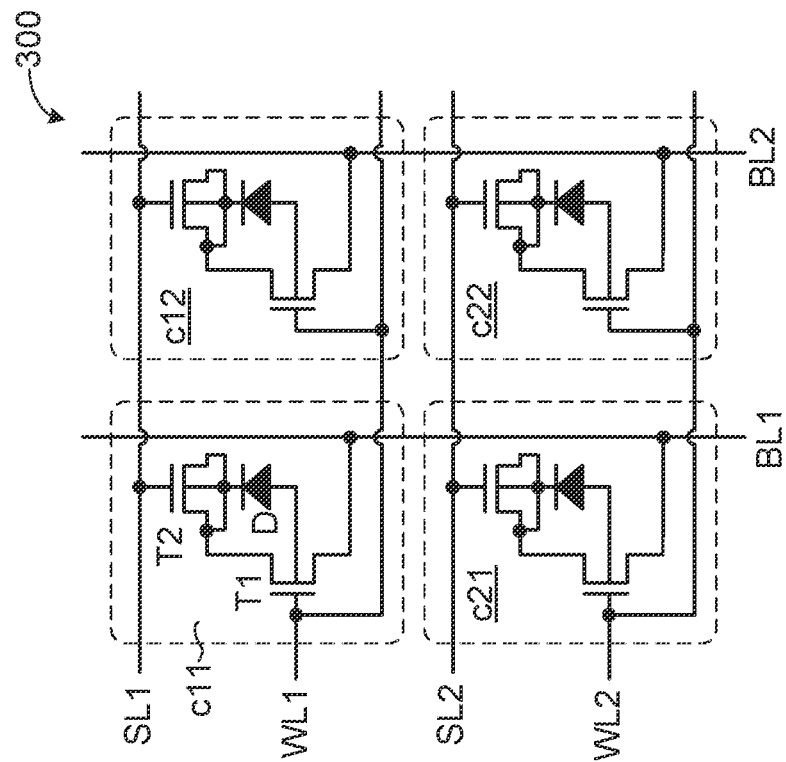
FIG. 4 is a schematic equivalent circuit diagram illustrating a cell array structure with plural resistive memory cells of the first embodiment.

Moreover, plural resistive memory cells can be combined as a cell array structure. FIG. 4 is a schematic equivalent circuit diagram illustrating a cell array structure with plural resistive memory cells of the first embodiment. The cell array structure comprises m×n resistive memory cells, wherein m and n are positive integers. For illustration, the cell array structure 300 of this embodiment comprises 2×2 random-access memory cells c11~c22. Each of the resistive random-access memory cells c11~c22 has the structure as shown in FIGS. 3C and 3D.

Please refer to the cell array structure 300 of FIG. 4. Both of the two resistive memory cells c11~c12 in the first row are connected with a first word line WL1 and a first source line SL1. Moreover, the resistive memory cells c11~c12 are connected with a first bit line BL1 and a second bit line BL2, respectively. Both of the two resistive memory cells c21~c22 in the second row are connected with a second word line WL2 and a second source line SL2. Moreover, the resistive memory cells c21~c22 are connected with the first bit line BL1 and the second bit line BL2, respectively.

By providing proper bias voltages to the word lines WL1~WL2, the source lines SL1~SL2 and the bit lines BL1~BL2 of the cell array structure 300, a forming action, a reset action, a set action or a read action can be selectively performed.

Figure 5A:
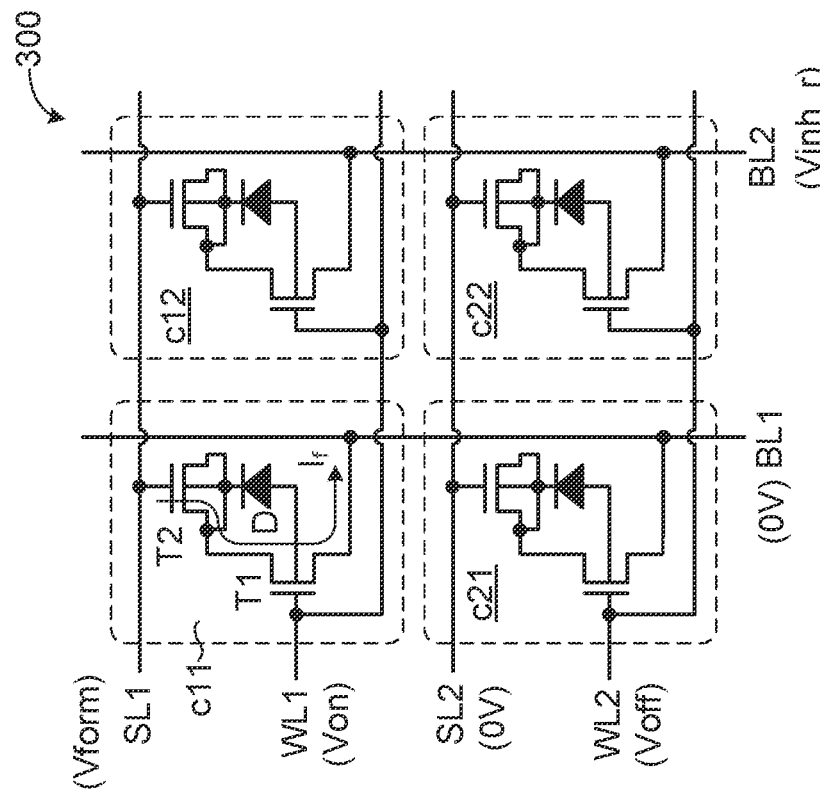
FIG. 5A schematically illustrates the bias voltages for performing a forming action on the cell array structure as shown in FIG. 4.
Figure 5C:
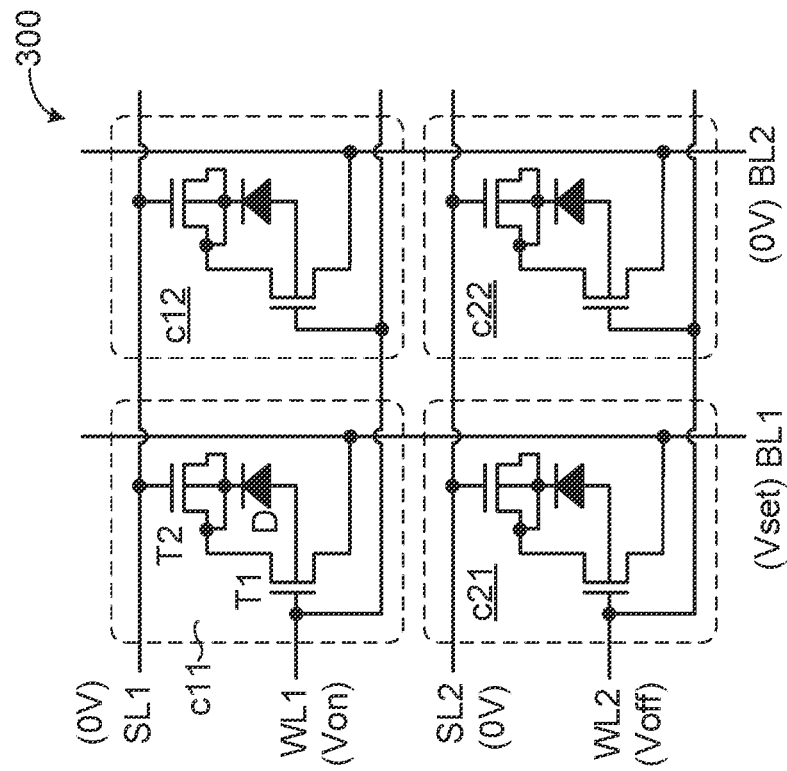
FIG. 5C schematically illustrates the bias voltages for performing a set action on the cell array structure as shown in FIG. 4.
Figure 5B:
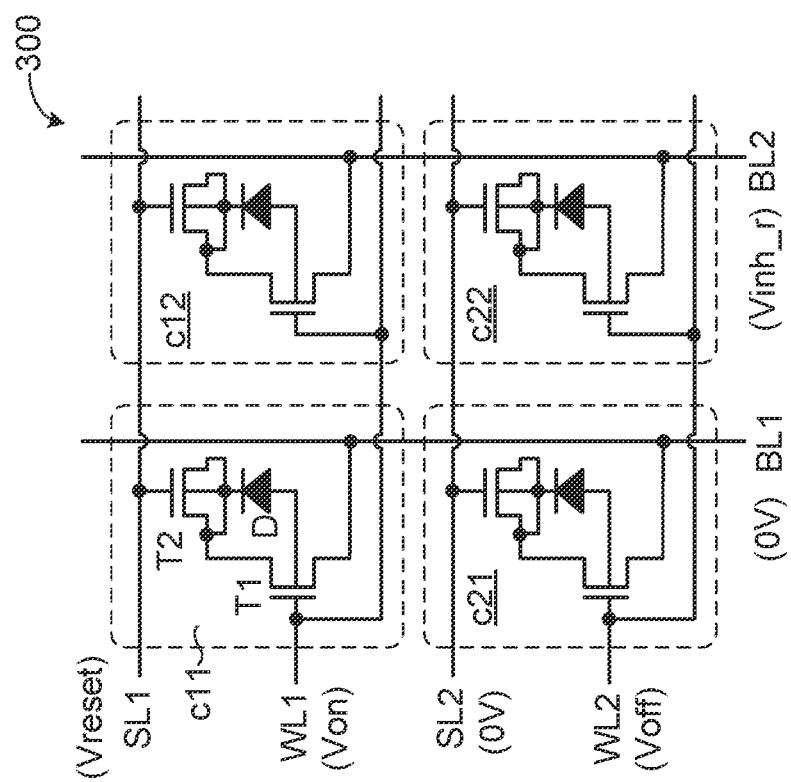
FIG. 5B schematically illustrates the bias voltages for performing a reset action on the cell array structure as shown in FIG. 4.

The bias voltages for performing different actions on the cell array structure 300 are shown in FIGS. 5A-5C. Whenever the cell array structure 300 is enabled, one word line is activated. The row of the cell array structure 300 corresponding to the activated word line is referred as a selected row. The rows of the cell array structure 300 corresponding to the other word lines are unselected rows.

After the cell array structure 300 is manufactured, the resistive memory cells c11~c22 are all in an initial state. Consequently, it is necessary to perform a forming action. The bias voltages for performing a forming action on the cell array structure 300 are shown in FIG. 5A.

During the forming operation, the first word line WL1 receives an on voltage (Von), the second word line WL2 receives an off voltage (Voff), the first source line SL1 receives a forming voltage (Vform), the second source line SL2 receives a ground voltage (0V), the first bit line BL1 receives the ground voltage (0V), and the second bit line BL2 receives an inhibit voltage (Vinh_r). Consequently, in the cell array structure 300, the first row connected to the first word line WL1 is a selected row, and the second row connected to the second word line WL2 is an unselected row. The forming voltage (Vform), the on voltage (Von) and the inhibit voltage (Vinh_r) are all positive voltages. The forming voltage (Vform) is higher than the on voltage (Von), and the forming voltage (Vform) is higher than or equal to the inhibit voltage (Vinh_r). For example, the forming voltage (Vform) is 4V, the on voltage (Von) is 2V, the inhibit voltage (Vinh_r) is 2V, and the off voltage (Voff) is equal to the ground voltage (0V).

In the selected row, the first source line SL1 receives the forming voltage (Vform), and the first bit line BL1 receives the ground voltage (0V). Consequently, the resistive memory cell c11 is a selected memory cell. Since the second bit line BL2 receives the inhibit voltage (Vinh_r), the resistive memory cell c12 is an unselected memory cell. In the unselected row, the second word line WL2 receives the off voltage (Voff). Consequently, the resistive memory cells c21 and c22 are unselected memory cells.

In the selected memory cell c11, the first transistor T1 is turned on. Consequently, the insulation layer in the gate structure of the second transistor T2 is subjected to the forming voltage (Vform), and a forming current $I_f$ is generated between the first source line SL1 and the first bit line BL1. When the forming current $I_f$ flows through the insulation layer of the second transistor T2, a conducting filament is formed in the insulation layer. The method of performing the forming action on each of the other resistive memory cells c12~c22 is similar to the method of performing the forming action on the resistive memory cell c11 through the provision of proper bias voltages.

Generally, if the magnitude of the forming current $I_f$ is too large during the forming action, the insulation layer in the selected memory cell c11 is possibly burnt out. After the insulation layer in the selected memory cell c11 is burnt out, the state of the selected memory cell c11 cannot be switched. For solving these drawbacks, a current limiter is connected with the first source line SL1 or the first bit line BL1 of the selected memory cell c11 to limit the magnitude of the forming current $I_f$ and prevent the insulation layer in the selected memory cell c11 from being burnt out.

FIG. 5B schematically illustrates the bias voltages for performing a reset action on the cell array structure as shown in FIG. 4. In an exemplary embodiment, for the reset action in the bipolar operation mode, the selected memory cell c11 can be biased to have a positive voltage difference between the first source line SL1 and first bit line BL1 such that $V_{SL1}-V_{BL1}>0$. In detail, during the reset action, the first word line WL1 receives the on voltage (Von), the second word line WL2 receives the off voltage (Voff), the first source line SL1 receives a reset voltage (Vreset), the second source line SL2 receives the ground voltage (0V), the first bit line BL1 receives the ground voltage (0V) which is lower than the reset voltage, and the second bit line BL2 receives the inhibit voltage (Vinh_r). Consequently, the resistive memory cell c11 is a selected memory cell, and the resistive memory cells c12~c22 are unselected memory cells.

The reset voltage (Vreset), the on voltage (Von) and the inhibit voltage (Vinh_r) are all positive voltages thus the selected memory cell c11 is biased to have the positive voltage difference (i.e. Vreset-$V_{BL1}>0$). The reset voltage (Vreset) is higher than the turn-on voltage (Von). The reset voltage (Vreset) is higher than or equal to the inhibit voltage (Vinh_r). For example, the reset voltage (Vreset) is 1.5V, the on voltage (Von) is 0.8V, the inhibit voltage (Vinh_r) is 0.8V, and the off voltage (Voff) is the ground voltage (0V).

In the selected memory cell c11, the first transistor T1 is turned on. Consequently, the insulation layer in the gate structure of the second transistor T2 is subjected to the reset voltage (Vreset). Under this circumstance, the second transistor T2 is in a reset state corresponding to a high resistance value. That is, the selected memory cell is in the reset state corresponding to the high resistance value. The method of performing the reset action on each of the other resistive memory cells c12~c22 is similar to the method of performing the reset action on the resistive memory cell c11 through the provision of proper bias voltages.

FIG. 5C schematically illustrates the bias voltages for performing a set action on the cell array structure as shown in FIG. 4. In an exemplary embodiment, for the set action in the bipolar operation mode, the selected memory cell can be biased to have a negative voltage difference between the first source line SL1 and the first bit line BL1 such that $V_{SL1}-V_{BL1}<0$. In detail, during the set action, the first word line WL1 receives the on voltage (Von), the second word line WL2 receives the off voltage (Voff), the second source line SL2 receives the ground voltage (0V), the first bit line BL1 receives a set voltage (Vset), the first source line SL1 receives the ground voltage (0V) which is lower than the set voltage, and the second bit line BL2 receives the ground voltage (0V). Consequently, the resistive memory cell c11 is a selected memory cell, and the resistive memory cells c12~c22 are unselected memory cells. The set voltage (Vset) and the on voltage (Von) are both positive voltages thus the selected memory cell c11 is biased to have the negative voltage difference ($V_{SL1}$-Vset<0). For example, the set voltage (Vset) is 2.4V, the on voltage (Von) is 2.8V, and the off voltage (Voff) is the ground voltage (0V). In an embodiment, during the set action, a negative voltage can be applied to the first source line SL1, for example –2.5V, and the ground voltage (0V) can be applied to the first bit line BL1 thus the selected memory cell c11 can be biased to have the negative voltage difference for the bipolar operation mode.

In the selected memory cell c11, the first transistor T1 is turned on. Consequently, the insulation layer in the gate structure of the second transistor T2 is subjected to the set voltage (Vset). Under this circumstance, the second transistor T2 is in a set state corresponding to the low resistance value. That is, the selected memory cell is in the set state corresponding to the low resistance value. The method of performing the set action on each of the other resistive memory cells c12~c22 is similar to the method of performing the set action on the resistive memory cell c11 through the provision of proper bias voltages.

Please refer to FIGS. 5B and 5C again. When the reset action is performed, the gate terminal of the second transistor T2 receives the positive reset voltage Vreset, and the body terminal of the second transistor T2 receives the ground voltage (0V). When the set action is performed, the gate terminal of the second transistor T2 receives the ground voltage (0V), and the body terminal of the second transistor T2 receives the positive set voltage Vset. In other words, the resistive memory cell c11 is in the bipolar operation mode.

In the above embodiment, the first transistor T1 and the second transistor T2 are N-type transistors. It is noted that numerous modifications and alterations may be made while retaining the teachings of the invention. For example, in another embodiment, the first transistor T1 and the second transistor T2 are P-type transistors. That is, in the N-type well region PW, the P-type first doped region, the P-type second doped region and the first gate structure are collaboratively formed as a first transistor T1. The P-type second doped region, the P-type third doped region, a P-type implanted region and the second gate structure are collaboratively formed as a second transistor T2. Moreover, the P-type second doped region, the P-type third doped region and the P-type implanted region are overlapped with each other to be collaboratively formed as a P-type merged region.

It is noted that the resistive memory cell of the first embodiment may be modified. For example, the N-type merged region in the second transistor T2 can be formed through other methods. For example, in a semiconductor CMOS process, a lightly doped drain (LDD) region can be formed in the doped region. The step of forming the lightly doped drain (LDD) region also forms the N-type merged region.

Figure 6A:
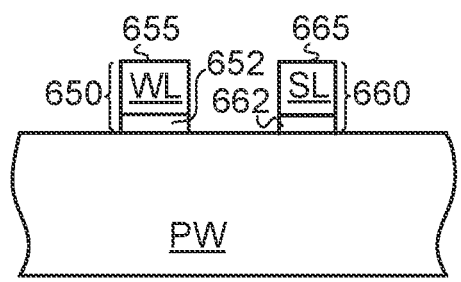
FIGS. 6A, 6B and 6C are schematic cross-sectional views illustrating a process of manufacturing a resistive memory cell according to a second embodiment of the present invention.
Figure 6B:
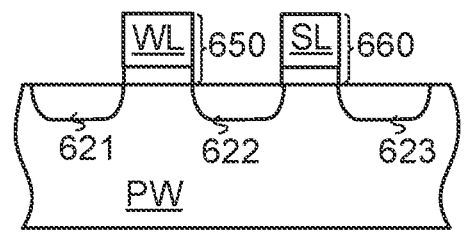
Figure 6C:
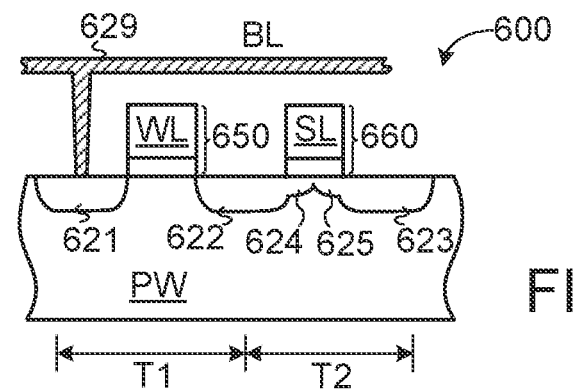

FIGS. 6A, 6B and 6C are schematic cross-sectional views illustrating a process of manufacturing a resistive memory cell according to a second embodiment of the present invention.

Please refer to FIG. 6A. Firstly, two gate structures 650 and 660 are formed over the surface of a P-well region PW. The first gate structure 650 comprises an insulation layer 652 and a conductive layer 655. The second gate structure 660 comprises an insulation layer 662 and a conductive layer 665. The conductive layer 655 is used as a word line WL. The conductive layer 665 is used as a source line SL. The structures and material layers of the two gate structures 650 and 660 are identical to those of the gate structures 250 and 260, and not redundantly described herein.

Please refer to FIG. 6B. After an implantation process is performed, a first doped region 621, a second doped region 622 and a third doped region 623 are formed under the exposed surface of the P-type well region PW. The first doped region 621, the second doped region 622 and the third doped region 623 are N-type doped regions. The first gate structure 650 is located over the surface of the P-type well region PW between the first doped region 621 and the second doped region 622. The second gate structure 660 is located over the surface of the P-type well region PW between the second doped region 622 and the third doped region 623.

Please refer to FIG. 6C. Then, two extended LDD regions 624 and 625 are extended from the second doped region 622 and the third doped region 623, which are located at two sides of the second gate structure 660. The extended LDD region 624 is located under the second gate structure 660 and contacted with the second doped region 622. The extended LDD region 625 is located under the second gate structure 660 and contacted with the third doped region 623. In addition, the extended LDD region 624 and the extended LDD region 625 are collaboratively formed as an N-type merged region. In other words, the second gate structure 660 is located over the N-type merged region.

Then, a metal layer 629 is connected with the first doped region 621 through a contact hole. Meanwhile, the resistive memory cell 600 is fabricated. The metal layer 629 is used as a bit line BL of the resistive memory cell 600.

Please refer to FIG. 6C again. In the P-type well region PW, the first doped region 621, the second doped region 622 and the first gate structure 650 are collaboratively formed as a first transistor T1. The second doped region 622, the third doped region 623, the extended LDD region 624, the extended LDD region 625 and the second gate structure 660 are collaboratively formed as a second transistor T2. Since the second doped region 622, the third doped region 623, the extended LDD region 624, the extended LDD region 625 are collaboratively formed as the N-type merged region, it can be considered that two drain/source terminals and a body terminal of the second transistor T2 are connected with each other. Moreover, a p-n junction is formed between the N-type merged region and the P-type well region PW. The p-n junction can be regarded as a diode.

The equivalent circuit diagram of the resistive memory cell 600 is similar to that of the resistive memory cell 300 as shown in FIG. 3D, and not redundantly described herein. Moreover, plural resistive memory cells 600 can be combined as a cell array structure. The operations of the cell array structure are similar to those as shown in FIGS. 5A, 5B and 5C. In other words, the resistive memory cell 600 is in the bipolar operation mode. Alternatively, the transistors of the resistive memory cell 600 are P-type transistors.

Figure 7A:
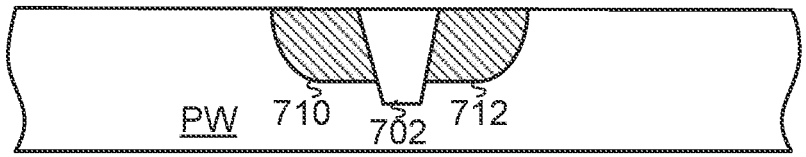
FIGS. 7A, 7B and 7C are schematic cross-sectional views illustrating a process of manufacturing a resistive memory cell according to a third embodiment of the present invention.
Figure 7B:
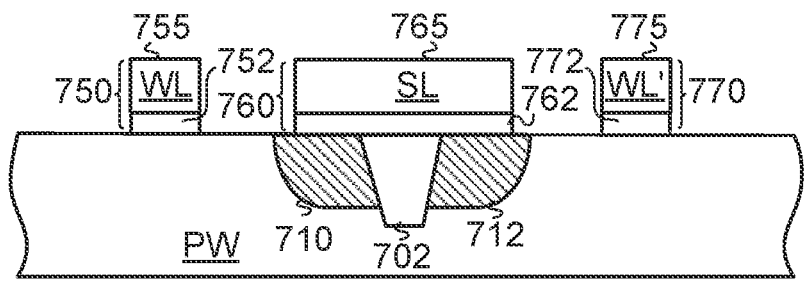
Figure 7C:
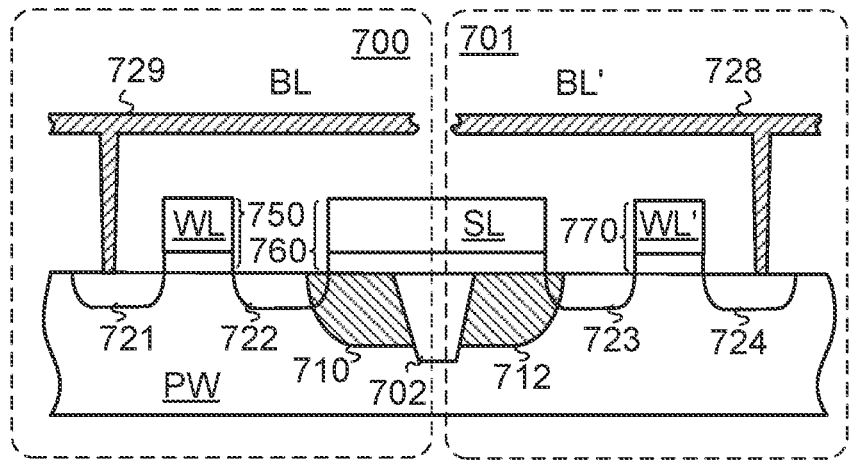

FIGS. 7A, 7B and 7C are schematic cross-sectional views illustrating a process of manufacturing a resistive memory cell according to a third embodiment of the present invention.

Please refer to FIG. 7A. Firstly, an isolation structure 702 is formed in a P-well region PW. Then, two N-type implanted regions 710 and 712 are located beside two sides of the isolation structure 702, respectively. The isolation structure 702 is a shallow trench isolation (STI) structure. It is noted that numerous modifications and alterations may be made while retaining the teachings of the invention. For example, in another embodiment, an N-type implanted region is firstly formed in the surface of the P-well region PW, and then an isolation structure is formed in the N-type implanted region to divide the N-type implanted region into two parts.

Please refer to FIG. 7B. Then, three gate structures 750, 760 and 770 are formed. The first gate structure 750 is located beside a first side of the isolation structure 702 and located over the surface of the P-well region PW. The second gate structure 760 is located over the surfaces of the N-type implanted regions 710 and 712 and the isolation structure 702. The third gate structure 770 is located beside a second side of the isolation structure 702 and located over the surface of the P-well region PW.

The first gate structure 750 comprises an insulation layer 752 and a conductive layer 755. The second gate structure 760 comprises an insulation layer 762 and a conductive layer 765. The third gate structure 770 comprises an insulation layer 772 and a conductive layer 775. The conductive layer 755 is used as a word line WL. The conductive layer 765 is used as a source line SL. The conductive layer 775 is used as another word line WL'. The structures and material layers of the two gate structures 750, 760 and 770 are identical to those of the gate structures 250 and 260, and not redundantly described herein.

Please refer to FIG. 7C. After an implantation process is performed, a first doped region 721, a second doped region 722, a third doped region 723 and a fourth doped region 724 are formed under the exposed surface of the P-type well region PW. The first gate structure 750 is located over the surface of the P-type well region PW between the first doped region 721 and the second doped region 722. The second gate structure 760 is located over the surfaces of the N-type implanted regions 710 and 712 and the isolation structure 702 between the second doped region 722 and the third doped region 723. The third gate structure 770 is located over the surface of the P-type well region PW between the third doped region 723 and the fourth doped region 724. Moreover, the second doped region 722 and the N-type implanted region 710 are collaboratively formed as an N-type merged region, and the third doped region 723 and the N-type implanted region 712 are collaboratively formed as another N-type merged region.

After a metal layer 729 is connected with the first doped region 721 through a contact hole, a resistive memory cell 700 is fabricated. In addition, after a metal layer 728 is connected with the fourth doped region 724 through another contact hole, another resistive memory cell 701 is fabricated. The metal layer 729 is used as a bit line BL of the resistive memory cell 700. The metal layer 728 is used as a bit line BL' of the resistive memory cell 701.

In FIG. 7C, two resistive memory cells 700 and 701 are shown. The source line SL is shared by the two resistive memory cells 700 and 701. In the resistive memory cell 700, the first doped region 721, the second doped region 722 and the first gate structure 750 are collaboratively formed as a first transistor T1, and the second doped region 722 and the second gate structure 760 are collaboratively formed as a second transistor T2. The second doped region 722 and the N-type implanted region 710 are collaboratively formed as an N-type merged region. Moreover, a p-n junction is formed between the N-type merged region and the P-type well region PW. The p-n junction can be regarded as a diode.

The resistive memory cell 701 also comprises two transistors T1' and T2'. The structure of the resistive memory cell 701 is similar to the structure of the resistive memory cell 700, and not redundantly described herein.

The equivalent circuit diagram of each of the resistive memory cells 700 and 701 is similar to that of the resistive memory cell 300 as shown in FIG. 3D, and not redundantly described herein. Moreover, plural resistive memory cells 700 and 701 can be combined as cell array structures. The operations of the cell array structure are similar to those as shown in FIGS. 5A, 5B and 5C. In other words, the resistive memory cells 700 and 701 are in the bipolar operation mode. Alternatively, the transistors of the resistive memory cells 700 and 701 are P-type transistors.

Figure 8:
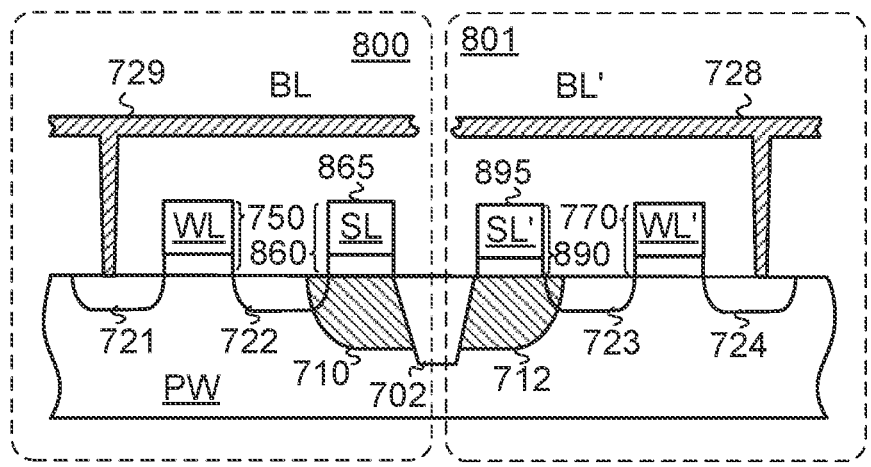
FIG. 8 is a schematic cross-sectional view illustrating a resistive memory cell according to a fourth embodiment of the present invention.

FIG. 8 is a schematic cross-sectional view illustrating a resistive memory cell according to a fourth embodiment of the present invention. In comparison with the resistive memory cells 700 and 701, the resistive memory cells 800 and 801 do not have the shared source line. That is, the N-type implanted region 710 is located between the isolation structure 702 and the second doped region 722, and the N-type implanted region 712 is located between the isolation structure 702 and the third doped region 723. The gate structure 860 of the resistive memory cell 800 is formed on the surface of the N-type implanted region 710, and the conductive layer 865 is used as a source line SL. Moreover, the gate structure 890 of the resistive memory cell 810 is formed on the surface of the N-type implanted region 712, and the conductive layer 895 is used as another source line SL'.

The equivalent circuit diagram of each of the resistive memory cells 800 and 801 is similar to that of the resistive memory cell 300 as shown in FIG. 3D, and not redundantly described herein. Moreover, plural resistive memory cells 800 and 801 can be combined as cell array structures. The operations of the cell array structure are similar to those as shown in FIGS. 5A, 5B and 5C. In other words, the resistive memory cells 800 and 801 are in the bipolar operation mode. Alternatively, the transistors of the resistive memory cells 800 and 801 are P-type transistors.

Figure 9A:
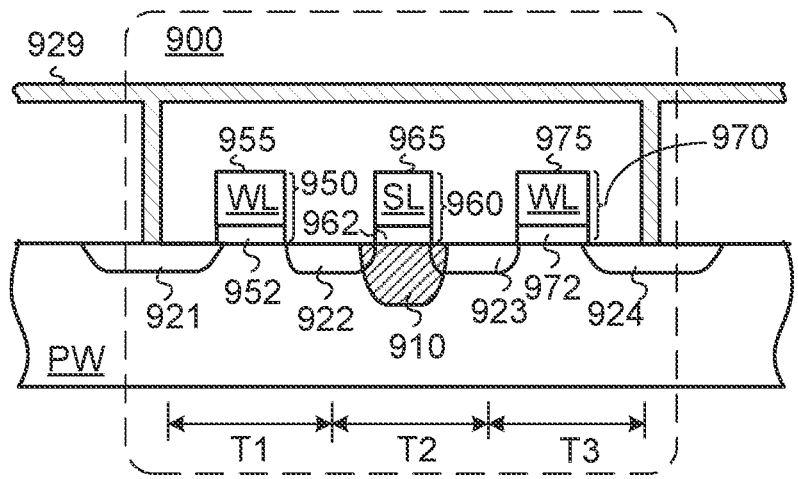
FIG. 9A is a schematic cross-sectional view illustrating a resistive memory cell according to a fifth embodiment of the present invention.
Figure 9B:
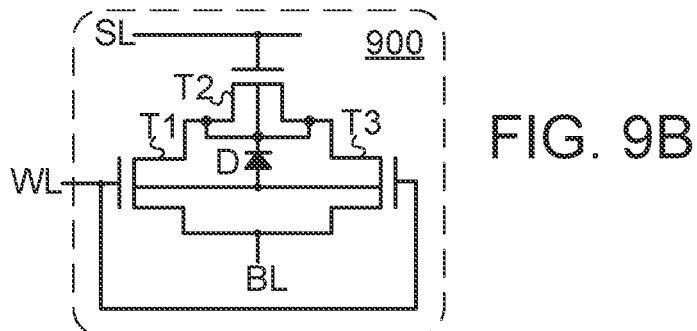
FIG. 9B is a schematic equivalent circuit diagram illustrating the resistive memory cell as shown in FIG. 9A.

FIG. 9A is a schematic cross-sectional view illustrating a resistive memory cell according to a fifth embodiment of the present invention. FIG. 9B is a schematic equivalent circuit diagram illustrating the resistive memory cell as shown in FIG. 9A.

Please refer to FIG. 9A. Firstly, an N-type implanted region 910 is formed in a P-well region PW. Then, three gate structures 950, 960 and 970 are formed. The first gate structure 950 is located over the surface of the P-well region PW. The second gate structure 960 is located over the surface of the N-type implanted regions 910. The third gate structure 970 is located over the surface of the P-well region PW. The gate structures 950, 960 and 970 have the same structure.

The first gate structure 950 comprises an insulation layer 952 and a conductive layer 955. The second gate structure 960 comprises an insulation layer 962 and a conductive layer 965. The third gate structure 970 comprises an insulation layer 972 and a conductive layer 795. The conductive layers 955 and 975 are used as a word line WL. The conductive layer 965 is used as a source line SL. The structures and material layers of the two gate structures 950, 960 and 970 are identical to those of the gate structures 250 and 260, and not redundantly described herein.

After an implantation process is performed, a first doped region 921, a second doped region 922, a third doped region 923 and a fourth doped region 924 are formed under the exposed surface of the P-type well region PW. The first gate structure 950 is located over the surface of the P-type well region PW between the first doped region 921 and the second doped region 922. The second gate structure 960 is located over the surface of the N-type implanted region 910 between the second doped region 922 and the third doped region 923. The third gate structure 970 is located over the surface of the P-type well region PW between the third doped region 923 and the fourth doped region 924. Moreover, the second doped region 922, the third doped region 923 and the N-type implanted region 910 are collaboratively formed as an N-type merged region. That is, the second gate structure 960 is located over the N-type merged region.

After a metal layer 929 is connected with the first doped region 921 and the fourth doped region 924 through contact holes, a resistive memory cell 900 is fabricated. The metal layer 929 is used as a bit line BL of the resistive memory cell 900.

Please refer to FIG. 9A again. In the P-type well region PW, the first doped region 921, the second doped region 922 and the first gate structure 950 are collaboratively formed as a first transistor T1; the second doped region 922, the third doped region 923 and the second gate structure 960 are collaboratively formed as a second transistor T2; and the third doped region 923, the fourth doped region 924 and the third gate structure 970 are collaboratively formed as a third transistor T3. Since the second doped region 922, the third doped region 923 and the N-type implanted region 910 are collaboratively formed as the N-type merged region, it can be considered that two drain/source terminals and a body terminal of the second transistor T2 are connected with each other. Moreover, a p-n junction is formed between the N-type merged region and the P-type well region PW. The p-n junction can be regarded as a diode.

As shown in FIG. 9B, the resistive memory cell 900 comprises the first transistor T1, the second transistor T2, the second transistor T3 and a diode D. The first drain/source terminal of the first transistor T1 is connected with the bit line BL. The gate terminal of the first transistor T1 is connected with the word line WL. The first drain/source terminal, the second drain/source terminal and the body terminal of the second transistor T2 are connected with each other. The first drain/source terminal of the second transistor T2 is connected with the second drain/source terminal of the first transistor T1. The gate terminal of the second transistor T2 is connected to with the source line SL. The first drain/source terminal of the third transistor T3 is connected with the second drain/source terminal of the second transistor T2. The gate terminal of the third transistor T3 is connected with the word line WL. The second drain/source terminal of the third transistor T3 is connected to the bit line BL. A first terminal of the diode D is connected with the body terminal of the second transistor T2. A second terminal of the diode D is connected with the body terminal of the first transistor T1 and the body terminal of the third transistor T3.

It is noted that numerous modifications and alterations may be made while retaining the teachings of the invention. For example, in another embodiment, the transistors of the resistive memory cell 900 are P-type transistors. Similarly, the N-type merged region in the second transistor T2 can be formed by using other methods. For example, the method of forming the lightly doped drain (LDD) region as shown in FIGS. 6A, 6B and 6C can be used to form the N-type merged region in the second transistor T2.

Figure 10:
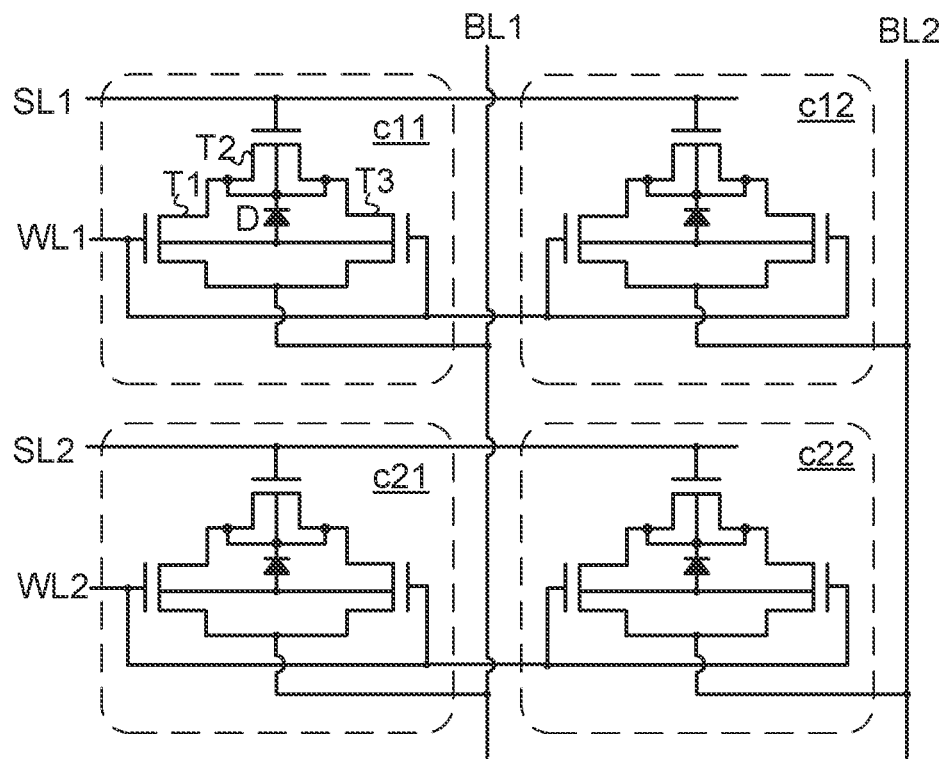
FIG. 10 is a schematic equivalent circuit diagram illustrating a cell array structure with plural resistive memory cells of the fifth embodiment.

Moreover, plural resistive memory cells can be combined as a cell array structure. FIG. 10 is a schematic equivalent circuit diagram illustrating a cell array structure with plural resistive memory cells of the fifth embodiment. The cell array structure 999 comprises m×n resistive memory cells, wherein m and n are positive integers. For illustration, the cell array structure 300 of this embodiment comprises 2×2 random-access memory cells c11~c22. Each of the resistive random-access memory cells c11~c22 has the structure as shown in FIGS. 9A and 9B.

Please refer to the cell array structure 999 of FIG. 10. Both of the two resistive memory cells c11~c12 in the first row are connected with a first word line WL1 and a first source line SL1. Moreover, the resistive memory cells c11~c12 are connected with a first bit line BL1 and a second bit line BL2, respectively. Both of the two resistive memory cells c21~c22 in the second row are connected with a second word line WL2 and a second source line SL2. Moreover, the resistive memory cells c21~c22 are connected with the first bit line BL1 and the second bit line BL2, respectively.

By providing proper bias voltages to the word lines WL1~WL2, the source lines SL1~SL2 and the bit lines BL1~BL2 of the cell array structure 999, a forming action, a reset action, a set action or a read action can be selectively performed.

Figure 11A:
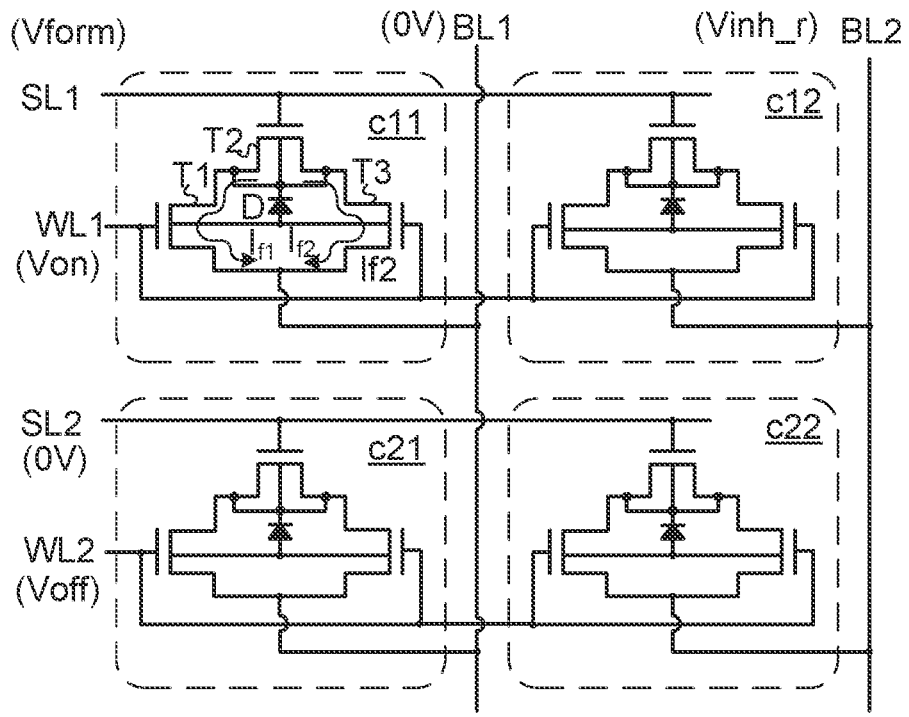
FIG. 11A schematically illustrates the bias voltages for performing a forming action on the cell array structure as shown in FIG. 10.
Figure 11B:
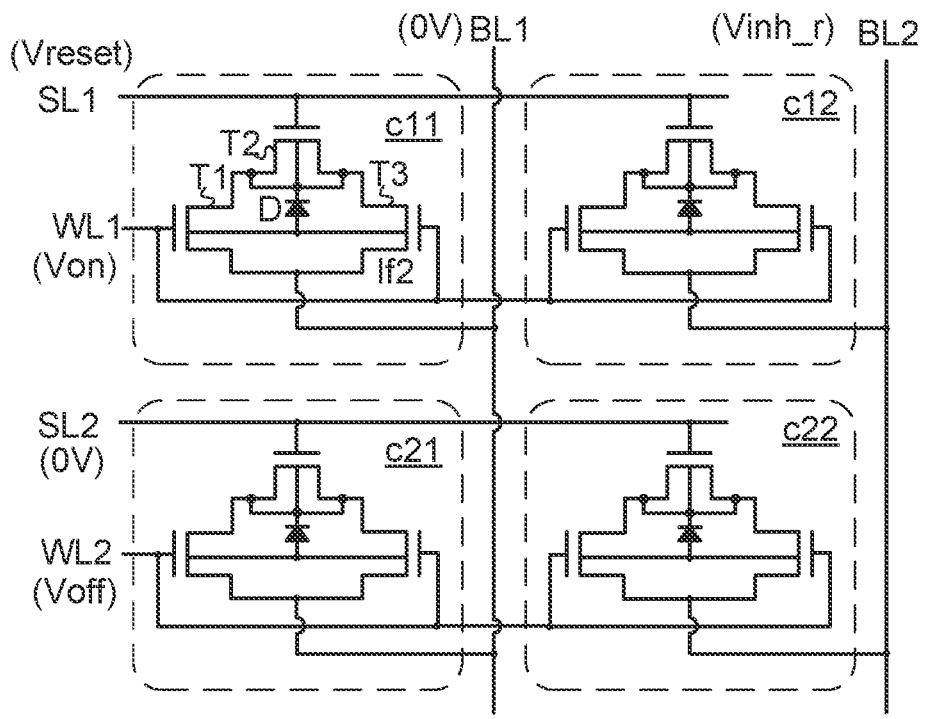
FIG. 11B schematically illustrates the bias voltages for performing a reset action on the cell array structure as shown in FIG. 10.
Figure 11C:
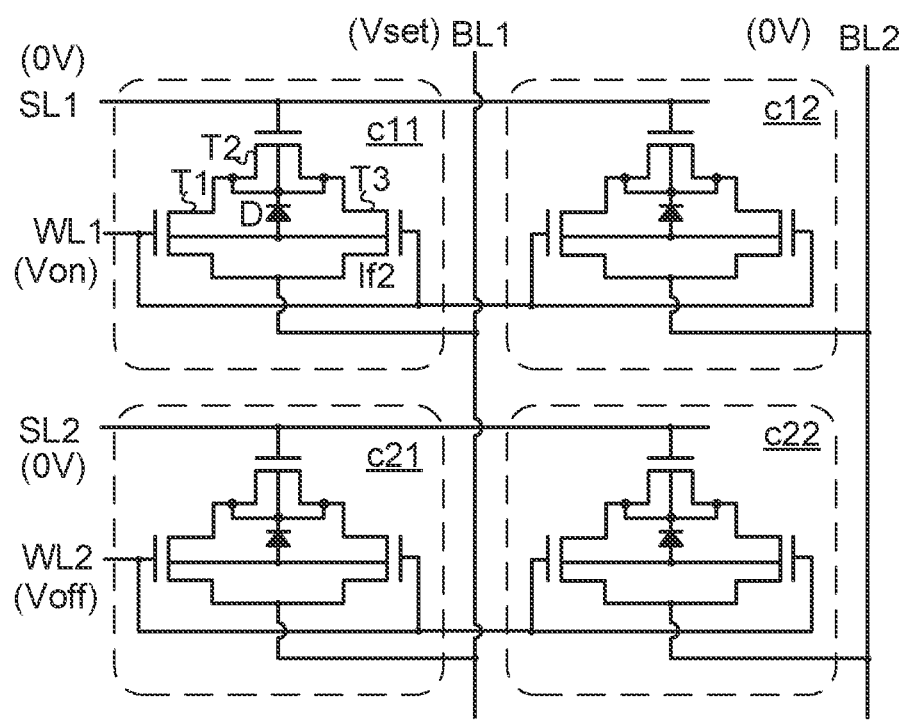
FIG. 11C schematically illustrates the bias voltages for performing a set action on the cell array structure as shown in FIG. 10.

The bias voltages for performing different actions on the cell array structure 999 are shown in FIGS. 11A-11C.

The bias voltages for performing a forming action on the cell array structure 999 are shown in FIG. 11A. During the forming operation, the first word line WL1 receives an on voltage (Von), the second word line WL2 receives an off voltage (Voff), the first source line SL1 receives a forming voltage (Vform), the second source line SL2 receives a ground voltage (0V), the first bit line BL1 receives the ground voltage (0V), and the second bit line BL2 receives an inhibit voltage (Vinh_r). Consequently, in the cell array structure 999, the first row connected to the first word line WL1 is a selected row, and the second row connected to the second word line WL2 is an unselected row. The forming voltage (Vform), the on voltage (Von) and the inhibit voltage (Vinh_r) are all positive voltages. The forming voltage (Vform) is higher than the on voltage (Von), and the forming voltage (Vform) is higher than or equal to the inhibit voltage (Vinh_r). For example, the forming voltage (Vform) is 4V, the on voltage (Von) is 2V, the inhibit voltage (Vinh_r) is 2V, and the off voltage (Voff) is equal to the ground voltage (0V).

In the selected row, the first source line SL1 receives the forming voltage (Vform), and the first bit line BL1 receives the ground voltage (0V). Consequently, the resistive memory cell c11 is a selected memory cell. Since the second bit line BL2 receives the inhibit voltage (Vinh_r), the resistive memory cell c12 is an unselected memory cell. In the unselected row, the second word line WL2 receives the off voltage (Voff). Consequently, the resistive memory cells c21 and c22 are unselected memory cells.

In the selected memory cell c11, the first transistor T1 and the third transistor T3 are turned on. Consequently, the insulation layer in the gate structure of the second transistor T2 is subjected to the forming voltage (Vform), and a forming current is generated between the first source line SL1 and the first bit line BL1. A first portion $I_{f1}$ of the forming current flows to the first bit line BL1 through the first transistor T1. A second portion $I_{f2}$ of the forming current flows to the first bit line BL1 through the third transistor T3. When the forming current flows through the insulation layer of the second transistor T2, a conducting filament is formed in the insulation layer. The method of performing the forming action on each of the other resistive memory cells c12~c22 is similar to the method of performing the forming action on the resistive memory cell c11 through the provision of proper bias voltages.

Generally, if the magnitude of the forming current is too large during the forming action, the insulation layer in the selected memory cell c11 is possibly burnt out. For solving these drawbacks, a current limiter is connected with the first source line SL1 or the first bit line BL1 of the selected memory cell c11 to limit the magnitude of the forming current and prevent the insulation layer in the selected memory cell c11 from being burnt out.

FIG. 11B schematically illustrates the bias voltages for performing a reset action on the cell array structure as shown in FIG. 10. During the reset action, the first word line WL1 receives the on voltage (Von), the second word line WL2 receives the off voltage (Voff), the first source line SL1 receives a reset voltage (Vreset), the second source line SL2 receives the ground voltage (0V), the first bit line BL1 receives the ground voltage (0V), and the second bit line BL2 receives the inhibit voltage (Vinh_r). Consequently, the resistive memory cell c11 is a selected memory cell, and the resistive memory cells c12~c22 are unselected memory cells. The reset voltage (Vreset), the on voltage (Von) and the inhibit voltage (Vinh_r) are all positive voltages. The reset voltage (Vreset) is higher than the turn-on voltage (Von). The reset voltage (Vreset) is higher than or equal to the inhibit voltage (Vinh_r). For example, the reset voltage (Vreset) is 1.5V, the on voltage (Von) is 0.8V, the inhibit voltage (Vinh_r) is 0.8V, and the off voltage (Voff) is the ground voltage (0V).

In the selected memory cell c11, the first transistor T1 and the third transistor T3 are turned on. Consequently, the insulation layer in the gate structure of the second transistor T2 is subjected to the reset voltage (Vreset). Under this circumstance, the second transistor T2 is in a reset state corresponding to a high resistance value. That is, the selected memory cell is in the reset state corresponding to the high resistance value. The method of performing the reset action on each of the other resistive memory cells c12~c22 is similar to the method of performing the reset action on the resistive memory cell c11 through the provision of proper bias voltages.

FIG. 11C schematically illustrates the bias voltages for performing a set action on the cell array structure as shown in FIG. 10. During the set action, the first word line WL1 receives the on voltage (Von), the second word line WL2 receives the off voltage (Voff), the first source line SL1 receives the ground voltage (0V), the second source line SL2 receives the ground voltage (0V), the first bit line BL1 receives a set voltage (Vset), and the second bit line BL2 receives the ground voltage (0V). Consequently, the resistive memory cell c11 is a selected memory cell, and the resistive memory cells c12~c22 are unselected memory cells. The set voltage (Vset) and the on voltage (Von) are both positive voltages. For example, the set voltage (Vset) is 2.4V, the on voltage (Von) is 2.8V, and the off voltage (Voff) is the ground voltage (0V).

In the selected memory cell c11, the first transistor T1 and the third transistor T3 are turned on. Consequently, the insulation layer in the gate structure of the second transistor T2 is subjected to the set voltage (Vset). Under this circumstance, the second transistor T2 is in a set state corresponding to the low resistance value. That is, the selected memory cell is in the set state corresponding to the low resistance value. The method of performing the set action on each of the other resistive memory cells c12~c22 is similar to the method of performing the set action on the resistive memory cell c11 through the provision of proper bias voltages.

Please refer to FIGS. 11B and 11C again. When the reset action is performed, the gate terminal of the second transistor T2 receives the positive reset voltage Vreset, and the body terminal of the second transistor T2 receives the ground voltage (0V). When the set action is performed, the gate terminal of the second transistor T2 receives the ground voltage (0V), and the body terminal of the second transistor T2 receives the positive reset voltage Vreset. In other words, the resistive memory cell c11 is in the bipolar operation mode.

From the above descriptions, the present invention provides a resistive memory cell in a bipolar operation mode and an associated cell array structure. By providing proper bias voltages, a forming action, a reset action or a set action can be selectively performed on the resistive random-access memory cell.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A cell array structure comprising a first resistive memory cell, the first resistive memory cell comprising:
    a first-type well region;
    a second-type first doped region formed under a surface of the first-type well region;
    a second-type merged region formed under the surface of the first-type well region, wherein the second-type merged region and the first-type well region are collaboratively formed as a first diode;
    a first gate structure formed over the surface of the first-type well region between the second-type first doped region and the second-type merged region, wherein the first gate structure comprises a stack structure with a first insulation layer and a first conductive layer, and the first conductive layer is served as a first word line, and wherein the second-type first doped region, the second-type merged region and the first gate structure are collaboratively formed as a first transistor;
    a second gate structure formed over the second-type merged region, wherein the second gate structure comprises a stack structure with a second insulation layer and a second conductive layer, and the second conductive layer is served as a first source line, and wherein the second-type merged region and the second gate structure are collaboratively formed as a second transistor; and
    a first metal layer connected with the second-type first doped region, wherein the first metal layer is served as a first bit line,
    wherein a first drain/source terminal of the first transistor is connected with the first bit line, a gate terminal of the first transistor is connected with the first word line, a first drain/source terminal of the second transistor is connected with a second drain/source terminal of the first transistor, a gate terminal of the second transistor is connected to with the first source line, a body terminal of the second transistor and the first drain/source terminal of the second transistor and a second drain/source terminal of the second transistor are connected with a first terminal of the first diode, and a body terminal of the first transistor is connected with a second terminal of the first diode,
    wherein during a forming action, the first source line receives a forming voltage, the first word line receives an on voltage, the first bit line receives a ground voltage, and a conducting filament is formed in the second insulation layer,
    wherein during a reset action, the first source line receives a reset voltage, the first word line receives the on voltage, and the first bit line receives a first voltage lower than the reset voltage, the first transistor is turned on, the first voltage is transmitted from the first bit line to the body terminal of the second transistor and to the first drain/source terminal of the second transistor and to the second drain/source terminal of the second transistor, so that the first resistive memory cell is switched from a set state to a reset state,
    wherein during a set action, the first word line receives the on voltage, the first bit line receives a set voltage, and the first source line receives a second voltage lower than the set voltage, the first transistor is turned on, the set voltage is transmitted from the first bit line to the body terminal of the second transistor and to the first drain/source terminal of the second transistor and to the second drain/source terminal of the second transistor, so that the first resistive memory cell is switched from the reset state to the set state,
    wherein the reset state is corresponding to a high resistance value, the set state is corresponding to a low resistance value, and the first resistive memory cell can be arbitrarily switched between the set state and the reset state.

2. The cell array structure as claimed in claim 1, wherein the second insulation layer comprises a high dielectric constant material layer.

3. The cell array structure as claimed in claim 2, wherein the high dielectric constant material layer is a hafnium dioxide layer or a tantalum oxide layer.

4. The cell array structure as claimed in claim 1, wherein during the forming action, the first source line or the first bit line is connected to a current limiter, so that a forming current generated by the first resistive memory cell is limited.

5. The cell array structure as claimed in claim 1, wherein the second-type merged region comprises a second-type implanted region and a second-type second doped region, wherein the second-type implanted region and the second-type second doped region are formed under the surface of the first-type well region and overlapped with each other, and the second gate structure is formed over the second-type implanted region.

6. The cell array structure as claimed in claim 5, wherein the first resistive memory cell further comprises an isolation structure formed in the first-type well region, and the second-type implanted region is located between the second-type second doped region and the isolation structure.

7. The cell array structure as claimed in claim 5, wherein the second-type merged region further comprises a second-type third doped region, wherein the second-type implanted region, the second-type second doped region and second-type third doped region are overlapped with each other.

8. The cell array structure as claimed in claim 5, wherein the second insulation layer of second gate structure is contacted with the second-type implanted region of the second-type merged region.

9. The cell array structure as claimed in claim 1, wherein the second-type merged region comprises:
  a second-type second doped region formed under the surface of the first-type well region and located beside a first side of the second gate structure;
  a second-type third doped region formed under the surface of the first-type well region and located beside a second side of the second gate structure;
  a first extended LDD region located under the second gate structure and contacted with the second-type second doped region; and
  a second extended LDD region located under the second gate structure and contacted with the second-type third doped region, wherein the first extended LDD region and the second extended LDD region are overlapped with each other.

10. The cell array structure as claimed in claim 1, wherein the first resistive memory cell further comprises:
  a second-type second doped region formed under the surface of the first-type well region; and
  a third gate structure formed over the surface of the first-well region between the second-type second doped region and the second-type merged region, wherein the third gate structure comprises a stack structure with a third insulation layer and a third conductive layer, and the third conductive layer is served as the first word line,
  wherein the first metal layer is connected with the second-type second doped region.

11. The cell array structure as claimed in claim 10, wherein the second-type second doped region, the second-type merged region and the third gate structure are collaboratively formed as a third transistor, a first drain/source terminal of the third transistor is connected with a second drain/source terminal of the second transistor, a gate terminal of the third transistor is connected with the first word line, a second drain/source terminal of the third transistor is connected to the first bit line and the second terminal of the first diode is connected with a body terminal of the third transistor.

12. The cell array structure as claimed in claim 11, wherein the cell array structure further comprises a second resistive memory cell, and the second resistive memory cell comprises a fourth transistor, a fifth transistor, a sixth transistor and a second diode, wherein a first drain/source terminal of the fourth transistor is connected with a second bit line, a gate terminal of the fourth transistor is connected with the first word line, a first drain/source terminal of the fifth transistor is connected with a second drain/source terminal of the fourth transistor, a gate terminal of the fifth transistor is connected to with the first source line, a first drain/source terminal of the sixth transistor is connected with a second drain/source terminal of the fifth transistor, a gate terminal of the sixth transistor is connected with the first word line, and a second drain/source terminal of the sixth transistor is connected to the second bit line, wherein a body terminal of the fifth transistor, the first drain/source terminal of the fifth transistor and the second drain/source terminal of the fifth transistor are connected with a first terminal of the second diode, and a second terminal of the second diode is connected with a body terminal of the fourth transistor and a body terminal of the sixth transistor.

13. The cell array structure as claimed in claim 12, wherein the cell array structure further comprises a third resistive memory cell, and the third resistive memory cell comprises a seventh transistor, an eighth transistor, a ninth transistor and a third diode, wherein a first drain/source terminal of the seventh transistor is connected with the first bit line, a gate terminal of the seventh transistor is connected with a second word line, a first drain/source terminal of the eighth transistor is connected with a second drain/source terminal of the seventh transistor, a gate terminal of the eighth transistor is connected to with a second source line, a first drain/source terminal of the ninth transistor is connected with a second drain/source terminal of the eighth transistor, a gate terminal of the ninth transistor is connected with the second word line, and a second drain/source terminal of the ninth transistor is connected to the first bit line, wherein a body terminal of the eighth transistor, the first drain/source terminal of the eighth transistor and the second drain/source terminal of the eighth transistor are connected with a first terminal of the third diode, and a second terminal of the third diode is connected with a body terminal of the seventh transistor and a body terminal of the ninth transistor.

14. The cell array structure as claimed in claim 1, wherein the second-type merged region and the first-type well region are collaboratively formed as a first diode, the second-type first doped region, the second-type merged region and the first gate structure are collaboratively formed as a first transistor, and the second-type merged region and the second gate structure are collaboratively formed as a second transistor, wherein a first drain/source terminal of the first transistor is connected with the first bit line, a gate terminal of the first transistor is connected with the first word line, a first drain/source terminal of the second transistor is connected with a second drain/source terminal of the first transistor, and a gate terminal of the second transistor is connected to with the first source line, wherein a body terminal of the second transistor, the first drain/source terminal of the second transistor and the second drain/source terminal of the second transistor are connected with a first terminal of the first diode, and a second terminal of the first diode is connected with a body terminal of the first transistor.

15. The cell array structure as claimed in claim 14, wherein the cell array structure further comprises a second resistive memory cell, and the second resistive memory cell comprises a third transistor, a fourth transistor and a second diode, wherein a first drain/source terminal of the third transistor is connected with the first a second bit line, a gate terminal of the third transistor is connected with the first word line, a first drain/source terminal of the fourth transistor is connected with a second drain/source terminal of the third transistor, and a gate terminal of the fourth transistor is connected to with the first source line, wherein a body terminal of the fourth transistor, the first drain/source terminal of the fourth transistor and the second drain/source terminal of the fourth transistor are connected with a first terminal of the second diode, and a second terminal of the second diode is connected with a body terminal of the third transistor.

16. The cell array structure as claimed in claim 15, wherein the cell array structure further comprises a third resistive memory cell, and the third resistive memory cell comprises a fifth transistor, a sixth transistor and a third diode, wherein a first drain/source terminal of the fifth transistor is connected with the first bit line, a gate terminal of the fifth transistor is connected with a second word line, a first drain/source terminal of the sixth transistor is connected with a second drain/source terminal of the fifth transistor, and a gate terminal of the sixth transistor is connected to with a second source line, wherein a body terminal of the sixth transistor, the first drain/source terminal of the sixth transistor and the second drain/source terminal of the sixth transistor are connected with a first terminal of the third diode, and a second terminal of the third diode is connected with a body terminal of the fifth transistor.

* * * * *